(12) United States Patent
Keays

(10) Patent No.: US 7,392,436 B2
(45) Date of Patent: Jun. 24, 2008

(54) PROGRAM FAILURE RECOVERY

(75) Inventor: Brady Keays, Half Moon Bay, CA (US)

(73) Assignee: Micron Technology, Inc., Boise, ID (US)

( * ) Notice: Subject to any disclaimer, the term of this patent is extended or adjusted under 35 U.S.C. 154(b) by 725 days.

(21) Appl. No.: 10/431,767

(22) Filed: May 8, 2003

(65) Prior Publication Data

US 2004/0237000 A1 Nov. 25, 2004

(51) Int. Cl.
*G06F 11/00* (2006.01)
(52) U.S. Cl. .......................... 714/52; 714/764
(58) Field of Classification Search ................ 714/763, 714/764, 6, 52; 365/185.09, 201, 2
See application file for complete search history.

(56) References Cited

U.S. PATENT DOCUMENTS

| | | | | |
|---|---|---|---|---|
| 4,578,751 A | * | 3/1986 | Erwin | 711/103 |
| 4,617,664 A | * | 10/1986 | Aichelmann et al. | 714/758 |
| 5,502,728 A | * | 3/1996 | Smith, III | 714/5 |
| 5,784,317 A | * | 7/1998 | Ha | 365/185.22 |
| 5,832,204 A | * | 11/1998 | Apperley et al. | 714/42 |
| 5,870,218 A | * | 2/1999 | Jyouno et al. | 365/185.03 |
| 5,870,520 A | * | 2/1999 | Lee et al. | 714/6 |
| 5,881,295 A | * | 3/1999 | Iwata | 710/262 |
| 6,041,423 A | * | 3/2000 | Tsukerman | 714/19 |
| 6,289,484 B1 | * | 9/2001 | Rothberg et al. | 714/769 |
| 6,782,446 B2 | * | 8/2004 | Akey et al. | 711/103 |
| 6,972,993 B2 | * | 12/2005 | Conley et al. | 365/185.04 |
| 7,111,224 B1 | * | 9/2006 | Trimberger | 714/764 |
| 2003/0033572 A1 | * | 2/2003 | Walton et al. | 714/763 |
| 2003/0117856 A1 | * | 6/2003 | Lee et al. | 365/189.05 |
| 2003/0217322 A1 | * | 11/2003 | Rodgers | 714/763 |
| 2004/0160829 A1 | * | 8/2004 | Tsujikawa et al. | 365/185.28 |
| 2004/0174741 A1 | * | 9/2004 | Tanaka | 365/185.08 |
| 2004/0237000 A1 | * | 11/2004 | Keays | 714/42 |
| 2006/0126394 A1 | * | 6/2006 | Li | 365/185.22 |
| 2006/0156192 A1 | * | 7/2006 | Nakamura et al. | 714/763 |

* cited by examiner

*Primary Examiner*—Scott Baderman
*Assistant Examiner*—Paul F Contino
(74) *Attorney, Agent, or Firm*—Leffert Jay & Polglaze, P.A.

(57) ABSTRACT

A method of operating a memory device when a program failure occurs is provided. The method includes preserving first data within the memory device and reconstructing second data originally intended for programming the memory device before the program failure from the first data

43 Claims, 5 Drawing Sheets

PROGRAM FAILURE RECOVERY

TECHNICAL FIELD OF THE INVENTION

The present invention relates generally to memory devices and in particular the present invention relates to the operation of memory devices when a program failure occurs.

BACKGROUND OF THE INVENTION

A flash memory device is a type of electrically erasable programmable read-only memory (EEPROM) and is used for non-volatile storage of data. Flash memory is being increasingly used to store execution codes and data in portable electronic products, such as computer systems.

A typical flash memory comprises a memory array having rows and columns of memory cells. Each of the memory cells is fabricated as a field-effect transistor having a control gate and a floating gate. The floating gate is capable of holding a charge and is separated by a thin oxide layer from source and drain regions contained in a substrate. Each of the memory cells can be electrically programmed (charged) by injecting electrons from the drain region through the oxide layer onto the floating gate. The charge can be removed from the floating gate by tunneling the electrons to the source through the oxide layer during an erase operation. Thus, the data in a memory cell is determined by the presence or absence of a charge on the floating gate.

NOR and NAND flash memory devices are two common types of flash memory devices, so called for the logical form the basic memory cell configuration in which each is arranged. Typically, for NOR flash memory devices, the control gate of each memory cell of a row of the array is connected to a word-select line, and the drain region of each memory cell of a column of the array is connected to a bit line. The memory array for NOR flash memory devices is accessed by a row decoder activating a row of floating gate memory cells by selecting the word-select line coupled to their gates. The row of selected memory cells then place their data values on the column bit lines by flowing a differing current if in a programmed state or not programmed state from a coupled source line to the coupled column bit lines.

The array of memory cells for NAND flash memory devices is also arranged such that the control gate of each memory cell of a row of the array is connected to a word-select line. However, each memory cell is not directly coupled to a column bit line by its drain region. Instead, the memory cells of the array are arranged together in strings, typically of 16 each, with the memory cells coupled together in series, source to drain, between a source line and a column bit line. The memory array for NAND flash memory devices is then accessed by a row decoder activating a row of memory cells by selecting the word-select line coupled to a control gate of a memory cell. In addition, the word-select lines coupled to the control gates of unselected memory cells of each string are driven to operate the unselected memory cells of each string as pass transistors, so that they pass current in a manner that is unrestricted by their stored data values. Current then flows from the source line to the column bit line through each series coupled string, restricted only by the selected memory cells of each string. This places the current-encoded data values of the row of selected memory cells on the column bit lines.

Many NAND flash memory devices provide two sets of registers (or latches) for use during program operations. These are usually referred to as cache latches and program latches. During programming operations, data are transferred from a host, such as a processor of a portable electronic product, into the cache latches. The data are then transferred from the cache latches into the program latches prior to the actual programming of a row of memory cells (commonly referred to as a page). This frees up the cache latches for additional data transfer from the host, while programming of the current data continues using the program latches in what is referred to as cache program operation.

In the event of a program failure, data transfer from the cache to program latches continues and the programming of this data in its specified location (or page) is still performed so that program data no longer remains within the flash device after a program operation has failed. A RAM buffer is often located externally to the flash device to retain the program data in case of failure. This data can be sent again to the flash device for programming in a new location (or page) as part of a recovery to ensure storage of the data.

The buffer size required for storing program data in case of failures is dictated by the page size of the flash memory. Therefore, as page size increases, e.g., due to increasing memory requirements, buffer size and thus buffer cost will increase.

For the reasons stated above, and for other reasons stated below which will become apparent to those skilled in the art upon reading and understanding the present specification, there is a need in the art for alternatives to using buffers for storing program data in case of failures.

SUMMARY

The above-mentioned problems with using buffers for storing program data in case of failures and other problems are addressed by the present invention and will be understood by reading and studying the following specification.

The various embodiments relate to data recovery when a program failure occurs during programming of a memory device. The data recovery involves reconstructing the data from data contained on the memory device when the program failure occurs. This avoids storing data on a buffer located externally to the memory device for programming the memory device in the event of a program failure.

For one embodiment, the invention provides a method of operating a memory device when a program failure occurs. The method includes preserving first data within the memory device and reconstructing second data originally intended for programming the memory device before the program failure from the first data.

For another embodiment, the invention provides a flash memory device having an array of flash memory cells and a command control circuit for controlling access to the array of flash memory cells. The command control circuit is adapted to perform a method when a program failure occurs. The method includes preserving first data within the memory device and reconstructing second data originally intended for programming the memory device before the program failure from the first data.

For another embodiment, the invention provides a memory system having a controller, a command link connected to the controller, a data link connected to the controller, and a flash memory device. The flash memory device has an array of flash memory cells, a first data register connected to the array of flash memory cells, a second data register connected to the first data register, to the array of flash memory cells, and to the data link, and a command control circuit for controlling access to the array of flash memory cells. The command control circuit connected to the command link and is adapted to perform a method when a program failure occurs. The method includes programming a first location of the array of memory cells with first data contained in the first data register when the program failure is detected and combining second data contained within a second location of the array of memory cells when the program failure is detected with the first data to reconstruct third data, within the first location, originally intended for programming the memory device before the program failure.

Further embodiments of the invention include methods and apparatus of varying scope.

DETAILED DESCRIPTION

Figure 1:
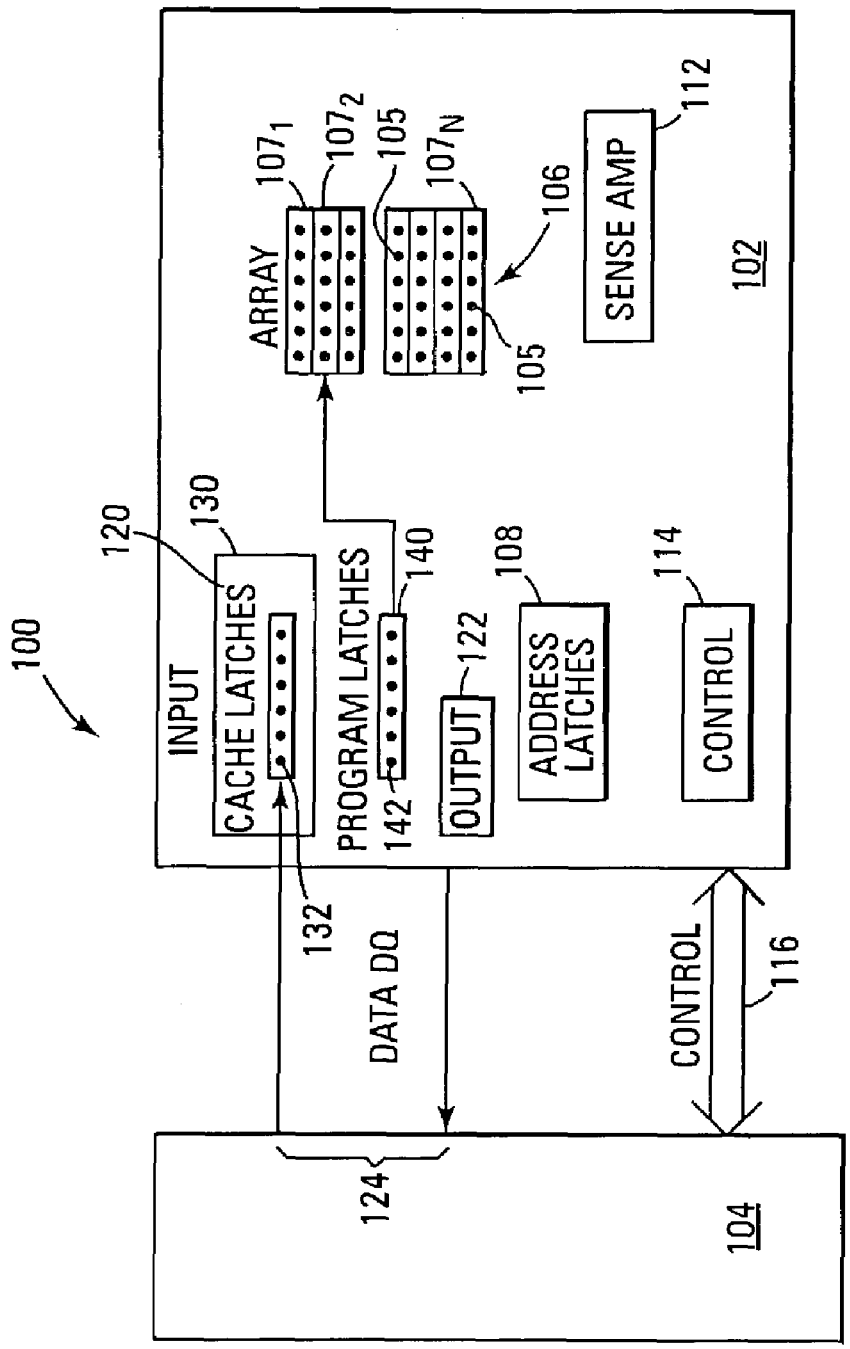
FIG. 1 is a block diagram of a flash memory system according to an embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 is a block diagram of a flash memory system 100 according to an embodiment of the present invention. Flash memory system 100 includes a memory (or mass storage) device 102, such as a NAND flash memory device, coupled to a processor or data controller 104. For one embodiment, memory device 102 includes an array 106 of individual storage locations (or memory cells) 105, e.g., flash memory cells, each cell having a distinct memory address. Array 106 is arranged in rows and columns, with the rows arranged in addressable blocks. For one embodiment, array 106 has rows (or pages) $107_1$ to $107_N$, as shown, where each of rows (or pages) $107_1$ to $107_N$ includes a plurality of memory cells 105. In other words, a plurality of memory cells 105 comprises one of rows (or pages) $107_1$ to $107_N$. Memory system 100 has been simplified to focus on features of the memory that are helpful in understanding the invention.

Data stored in the memory array 106 can be accessed using externally provided location addresses received by address latches 108 via a plurality of data (DQ) lines 124. Address signals are received and decoded to access the memory array 106. Sense amplifier and compare circuitry 112 is used to sense data stored in the memory cells and verify the accuracy of stored data. Command control circuit 114 decodes signals provided on control link 116 from the controller 104 and controls access to the memory cells of array 106. These signals are used to control the operations of the memory, including data read, data write, and erase operations.

A data input buffer circuit 120 and a data output buffer circuit 122 are included for bi-directional data communication over the plurality of data (DQ) lines 124 with the controller 102. For one embodiment, data input buffer circuit 120 includes cache latches (or data registers) 130. For another embodiment cache latches 130 include cache-latch cells 132 respectively corresponding to memory cells 105 of each of rows $107_1$ to $107_N$. Memory device 102 also includes program latches (or data registers) 140. For one embodiment, program latches 140 include program-latch cells 142 respectively corresponding to cache-latch cells 132 and of memory cells 105 of each of rows $107_1$, to $107_N$. For another embodiment, cache latches 130 are serially connected to program latches 140.

Figure 2A:
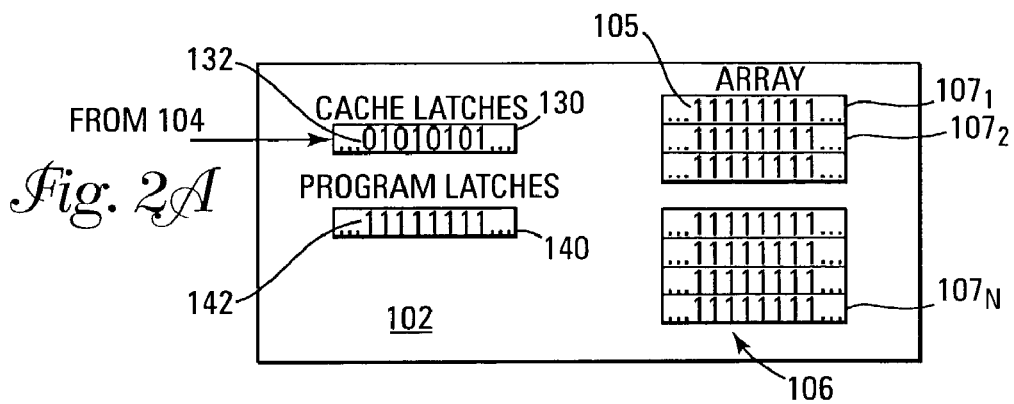
FIGS. 2A-2D illustrate data transfer during conventional programming of a memory array of the flash memory of FIG. 1.
Figure 2B:
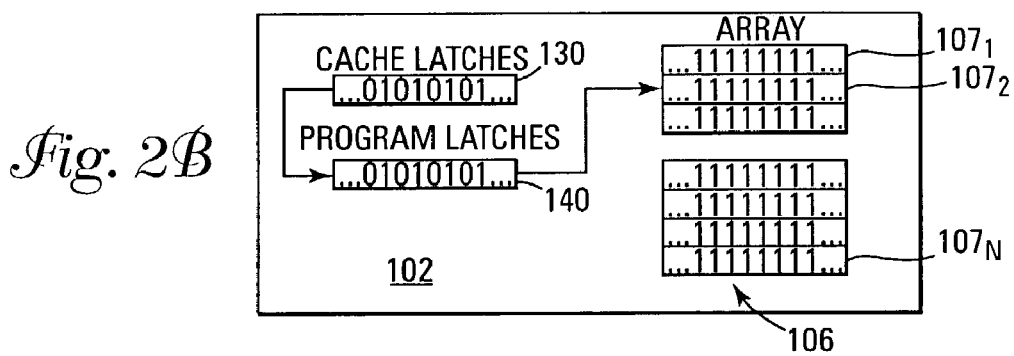
Figure 2C:
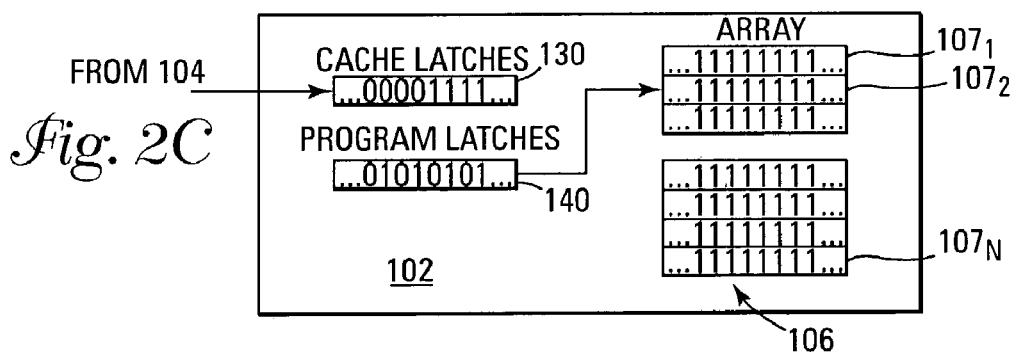
Figure 2D:
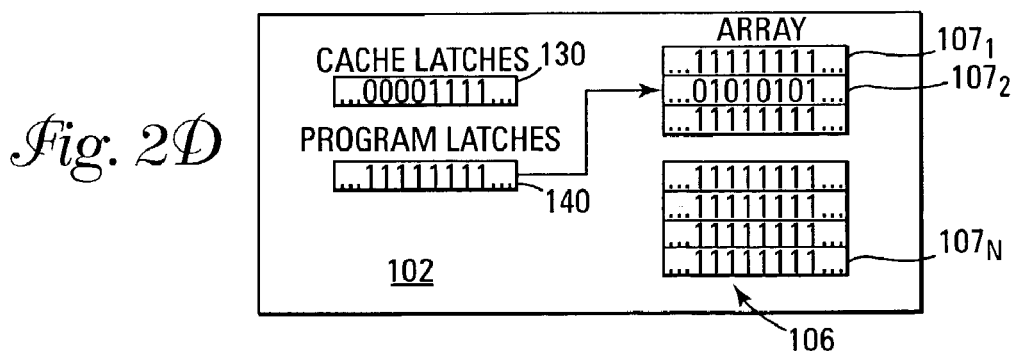

To program array 106, command control circuit 114 decodes program commands received from data controller 104. Programming of array 106 includes selecting a location within array 106 to program, e.g., row (or page) $107_2$ of array 106, as shown in FIG. 1. FIGS. 2A-2D illustrate data transfer during conventional programming of array 106. Data for row $107_2$ are transferred from controller 104 to cache latches 130, as shown in FIG. 2A. After the data for row $107_2$ are transferred to cache latches 130, these data are transferred from cache latches 130 to program latches 140, as shown in FIG. 2B, and programming of row $107_2$ commences. During programming of row $107_2$, another row of array 106 can be selected and data for that row can be transferred into cache latches 130 from controller 104, as shown in FIG. 2C. Also during programming of row $107_2$, the data for row $107_2$ are transferred from program latches 140 to row $107_2$, and the contents of program latches 140 are altered, as shown in FIG. 2D, e.g., returned to that of FIG. 2A.

Programming of row $107_2$ with the data of program latches 140 is accomplished by combining the data of row $107_2$ with the data of program latches 140 using a logical AND operation. For example, a zero (0) of the data of program latches 140 combined with a corresponding one (1) of the data of row $107_2$ using a logical AND causes a zero (0) to replace the one (1) in row $107_2$. A one (1) of the data of program latches 140 combined with a corresponding one (1) of the data of row $107_2$ using a logical AND produces a one (1) in row $107_2$. For one embodiment, programming row $107_2$ involves replacing the ones (1s) of row $107_2$ with the corresponding zeros (0s) of program latches 140.

The data are typically verified as they are transferred to row $107_2$, e.g., to determine if the data transferred to row $107_2$ matches the data previously in program latches 140. Note that the data in program latches 140 of FIG. 2C matches the data in row $107_2$ of FIG. 2D, indicating successful programming of row $107_2$. In one embodiment, as each memory cell 105 of row $107_2$ is programmed successfully (or verified) a one (1) is placed in a corresponding program-latch cell 142 of program latches 140. Note that each of the program-latch cells 142 of program latches 140 has one (1) in FIG. 2D, indicating that each of the corresponding memory cells 105 of row $107_2$ is verified and thus indicating successful programming of row $107_2$.

Figure 3A:
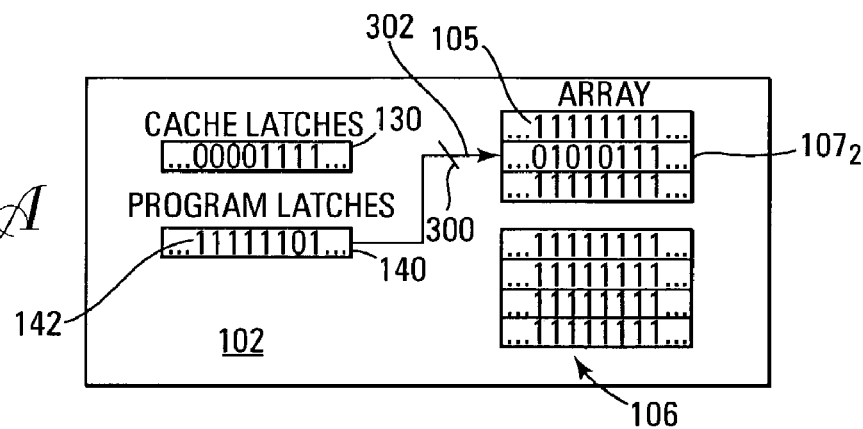
FIGS. 3A-3D illustrate data transfer during a method of operating a memory device when a program failure occurs according to an embodiment of the present invention.

If the data transferred to row $107_2$ does not match the data previously in program latches 140, a program failure occurs. This is illustrated by comparing the data in program latches 140 of FIG. 2C to the data in row $107_2$ (the failed location) of FIG. 3A. For one embodiment, when a memory cell of row $107_2$ fails to program (or verify) a zero (0) is placed in the corresponding program-latch cell 142 of program latches 140. For embodiments where programming row $107_2$ involves replacing the ones (1s) of row $107_2$ with the corresponding zeros (0s) of program latches 140, a program failure involves retaining a zero (0) in the program-latch cell 142 corresponding to the memory cell 105 of row $107_2$ where the failure occurred. Note that a zero (0) appears in program-latch cell 142 in program latches 140 in FIG. 3A indicative of the program failure in row $107_2$.

FIGS. 3A-3D illustrate data transfer within memory device 102 during a method 400, according to an embodiment of the present invention, of operating memory device 102 when a program failure is detected. For various embodiments, detecting a program failure involves command control circuit 114 detecting a zero (0) in program latches 140. A flowchart of method 400 is presented in FIG. 4. Command control circuit 114 is adapted to perform method 400 when a program failure is detected. Method 400 preserves the data within memory device 102 at block 410 when a program failure is detected. This is accomplished by stopping programming operations in progress before the program failure occurs when the program failure is detected. Stopping programming operations includes stopping the transfer of data to row $107_2$ from program latches 140 as indicated by a slash 300 passing through arrow 302 of FIG. 3A, and stopping altering the data within program latches 140. This preserves the data contained within row $107_2$ and program latches 140 at the time of the program failure. Stopping programming operations can also include stopping data transfer from controller 104 to cache latches 130 if data are being transferred from controller 104 to cache latches 130 when the program failure is detected and in another embodiment, stopping data transfer from cache latches 130 to program latches 140 if data are being transferred from cache latches 130 to program latches 140 when the program failure is detected. This preserves the data contained within cache latches 130 at the time of the program failure.

Figure 3B:
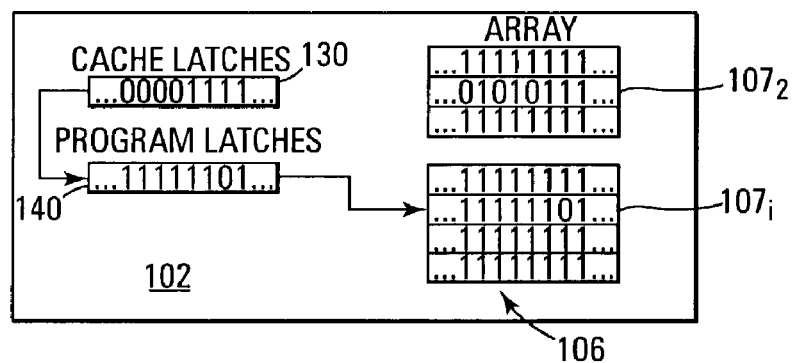
Figure 4:
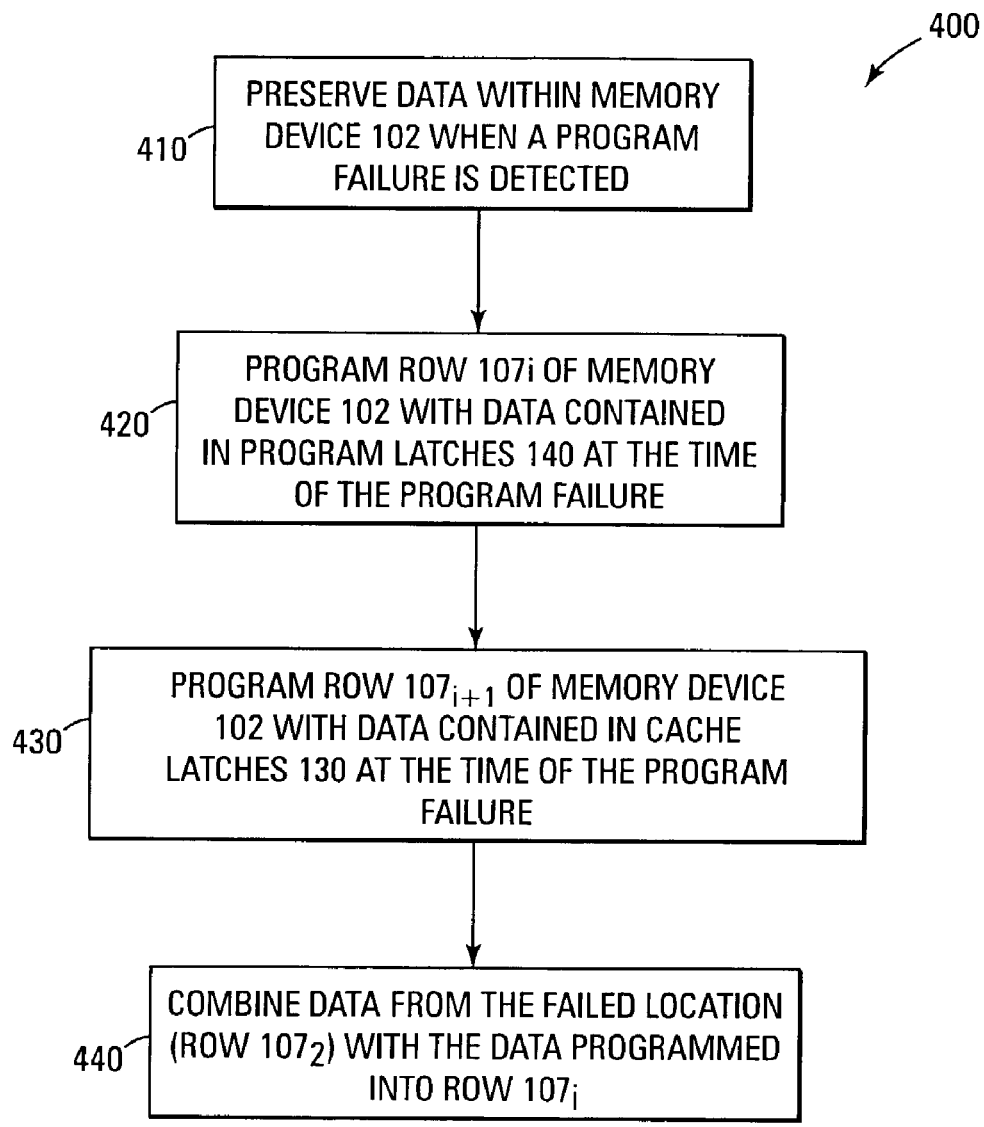
FIG. 4 is a flowchart of a method of operating a memory device when a program failure occurs according to another embodiment of the present invention.

At block 420, row (or page) $107_i$, for example, is programmed using the data contained in program latches 140 at the time of the program failure. This includes selecting row $107_j$ and transferring the data from program latches 140 to row $107_i$, as shown in FIG. 3B.

Figure 3C:
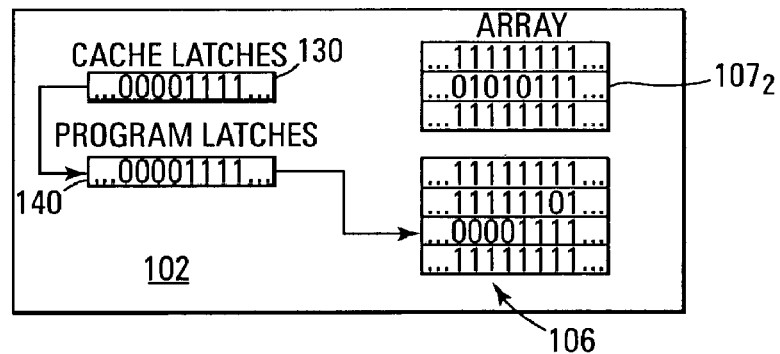

At block 430, row (or page) $107_{i+1}$, for example, is programmed using the data contained in cache latches 130 at the time of the program failure. This includes selecting row $107_{i+1}$, transferring the data from cache latches 130 to program latches 140, and transferring the data from program latches 140 to row $107_{i+1}$, as shown in FIG. 3C.

Figure 3D:
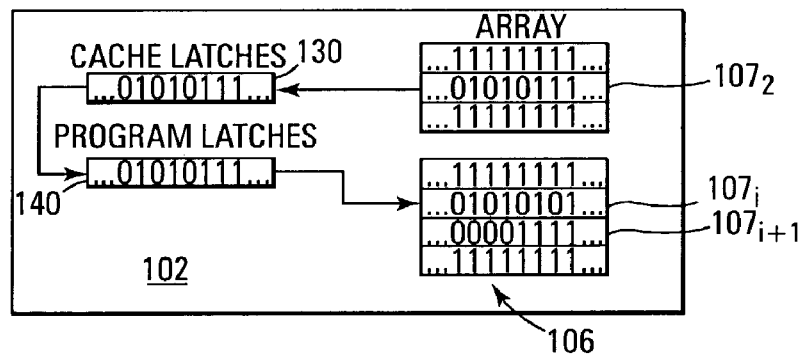

At block 440 failed data from row $107_2$ is combined with the data stored in row $107_i$, e.g., by programming or copying the failed data from row $107_2$ on top of the data stored in row $107_i$. This reconstructs the data originally intended for row $107_2$ at row $107_i$ before the program failure, as shown in FIG. 3D. Note that the data in row $107_i$ of FIG. 3D match those in program latches 140 (the data originally intended for row $107_2$ before the program failure depicted in FIG. 3A) in FIG. 2C.

To combine failed data from row $107_2$ with the data stored in row $107_i$, the failed data are transferred from row $107_2$ to cache latches 130, as shown in FIG. 3D. The failed data are then transferred from cache latches 130 to program latches 140 and subsequently to row $107_i$. Transferring the failed data from program latches 140 to row $107_i$ involves programming row $107_i$ with the failed data from program latches 140. For one embodiment, the failed data from row $107_2$ are combined with the data stored in row $107_i$ using a logical AND operation as described above.

For one embodiment, row $107_2$ is assigned a defective status and is treated as a defect to avoid accessing the failed data therein during operation of memory device 102.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of operating a memory device when a program failure is detected, the method comprising:
   detecting a program failure during programming of the memory device;
   preserving first data within the memory device after the program failure; and
   reconstructing second data originally intended for programming the memory device before the program failure by combining the first data with failed third data that is contained within the memory device when the program failure is detected;
   wherein the preserved first data is different than the second data; and
   wherein the failed third data is different than the first and second data.

2. The method of claim 1, wherein preserving first data within the memory device comprises stopping programming of the memory device that is in progress when the program failure is detected.

3. The method of claim 1, wherein preserving first data within the memory device comprises stopping receiving fourth data for programming the memory device at the memory device from a location external to the memory device.

4. A method of operating a memory device when a program failure is detected, the method comprising:
   programming a first location of an array of memory cells of the memory device with first data contained in a first data register of the memory device when the program failure is detected; and
   combining failed second data, contained within a second location of the array of memory cells in which the program failure occurred when the program failure is detected, with the first data to reconstruct third data, within the first location, originally intended for programming the memory device before the program failure is detected;
   wherein the first data is different than the failed second data; and
   wherein the third data is different than the first and second data.

5. The method of claim 4, further comprising programming a third location of the array of memory cells, after programming the first location and before combining the first data with the second data, with fourth data contained in a second data register of the memory device when the program failure is detected.

6. The method of claim 5, further comprising transferring the fourth data from the second data register to the first data register before programming the third location.

7. The method of claim 4, further comprising stopping programming of the memory device that is in progress before the program failure occurs when the program failure is detected.

8. The method of claim 4, further comprising stopping receiving fourth data for programming the memory device at a second data register of the memory device from a location external to the memory device.

9. The method of claim 4, wherein combining the second data with the first data comprises combining the second data with the first data using a logical AND operation.

10. The method of claim 4, further comprising treating the second location as a defect.

11. A method of operating a memory device when a program failure is detected, the method comprising:
   transferring first data contained in a program latch of the memory device when the program failure is detected from the program latch to a first location of an array of memory cells of the memory device;
   transferring second data contained in a cache latch of the memory device when the program failure is detected from the cache latch to the program latch;
   transferring the second data from the program latch to a second location of the array of memory cells;
   transferring third data contained in a third location of the array of memory cells when the program failure is detected to the cache latch;
   transferring the third data from the cache latch to the program latch; and
   transferring the third data from the program latch to the first location of the array of memory cells so as to combine the first data with the third data for reconstructing fourth data originally intended for programming the third location of the array of memory cells before the program failure.

12. The method of claim 11, further comprising stopping receiving fifth data for programming the memory device at the cache latch from a location external to the memory device.

13. The method of claim 11, further comprising treating the third location as a defect.

14. A method of operating a memory device, comprising:
   receiving first data into a first latch of the memory device;
   transferring the first data from the first latch to a second latch of the memory device;
   receiving second data into the first latch;
   programming the first data from the second latch into a first plurality of storage locations of the memory device;
   verifying the programming of the first data into the first plurality of storage locations;
   modifying the data contained in the second latch as the programming is verified, thereby generating an indication of success or failure of individual storage locations of the first plurality of storage locations;
   upon detecting a failure of the programming of the first data into the first plurality of storage locations:
      programming the modified data of the second latch into a second plurality of storage locations of the memory device;
      transferring the second data from the first latch to the second latch;
      programming the second data from the second latch into a third plurality of storage locations of the memory device;
      transferring the failed data from the first plurality of storage locations to the second latch; and
      combining the failed data from the second latch with the modified data of the second plurality of storage locations.

15. The method of claim 14, wherein transferring the failed data from the first plurality of storage locations to the second latch further comprises transferring the failed data from the first plurality of storage locations to the first latch and transferring the failed data from the first latch to the second latch.

16. The method of claim 14, wherein programming and combining both comprise AND operations on the data between the second latch and a plurality of storage locations.

17. The method of claim 14, wherein each plurality of storage locations comprises a page of memory addresses.

18. A method of operating a mass storage device having at least two serially-connected data input latches coupled to a storage array, the method comprising:
   upon detecting a failure of a programming operation of a first location of the storage array using first data from a first data input latch:
      programming a second location of the storage array using second data from the first data input latch indicative of the failure;
      programming a third location of the storage array using third data from a second data input latch; and
      combining the failed data from the first location of the storage array with the second data in the second location of the storage array.

19. The method of claim 18, wherein programming and combining both comprise AND operations on the data between the first data input latch and a location of the storage array.

20. The method of claim 18, wherein programming the third location of the storage array using third data from the second data input latch comprises:
   transferring the third data to the first data input latch from the second data input latch; and
   transferring the third data into the third location of the storage array from the first data input latch.

21. The method of claim 18, wherein combining the failed data from the first location of the storage array with the second data in the second location of the storage array comprises:
   transferring the failed data from the first location of the storage array to the second data input latch;
   transferring the failed data to the first data input latch from the second data input latch; and
   transferring the failed data to the second location of the storage array from the first data input latch.

22. A flash memory device comprising:
   an array of flash memory cells; and
   a command control circuit for controlling access to the array of flash memory cells, wherein the command control circuit is adapted to perform a method when a program failure is detected, the method comprising:
      detecting a program failure during programming of the memory device;
      preserving first data within the memory device after the program failure; and
      reconstructing second data originally intended for programming the memory device before the program failure by combining the first data with failed third data that is contained within the memory device when the program failure is detected;
      wherein the preserved first data is different than the second data; and
      wherein the failed third data is different than the first and second data.

23. The memory device of claim 22, wherein preserving first data within the memory device of the method performed by the command control circuit comprises stopping programming of the array of flash memory cells that is in progress when the program failure is detected.

24. The memory device of claim 22, wherein preserving first data within the memory device of the method performed by the command control circuit comprises stopping receiving fourth data for programming the memory device at the memory device from a location external to the memory device.

25. A flash memory device comprising:
an array of flash memory cells;
a first data register connected to the array of flash memory cells;
a second data register connected to the first data register and to the array of flash memory cells; and
a command control circuit for controlling access to the array of flash memory cells, wherein the command control circuit is adapted to perform a method when a program failure is detected, the method comprising:
programming a first location of the array of flash memory cells with first data contained in the first data register when the program failure is detected; and
combining failed second data, contained within a second location of the array of memory cells in which the program failure occurred when the program failure is detected, with the first data to reconstruct third data, within the first location, originally intended for programming the memory device before the program failure is detected;
wherein the first data is different than the failed second data; and
wherein the third data is different than the first and second data.

26. The memory device of claim 25, wherein the method performed by the command control circuit further comprises programming a third location of the array of flash memory cells, after programming the first location and before combining the first data with the second data, with fourth data contained in the second data register when the program failure is detected.

27. The memory device of claim 26, wherein the method performed by the command control circuit further comprises transferring the fourth data from the second data register to the first data register before programming the third location.

28. The memory device of claim 25, wherein the method performed by the command control circuit further comprises stopping programming of the memory device that is in progress before the program failure occurs when the program failure is detected.

29. The memory device of claim 25, wherein the method performed by the command control circuit further comprises stopping receiving fourth data for programming the memory device at the second data register from a location external to the memory device.

30. The memory device of claim 25, wherein combining the second data with the first data of the method performed by the command control circuit comprises combining the data using a logical AND operation.

31. The memory device of claim 25, wherein the method performed by the command control circuit further comprises treating the second location as a defect.

32. A flash memory device comprising:
an array of flash memory cells;
a cache latch connected to the array of flash memory cells;
a program latch connected to the array of flash memory cells and to the cache latch; and
a command control circuit for controlling access to the array of flash memory cells, wherein the command control circuit is adapted to perform a method when a program failure occurs, the method comprising:
transferring first data contained in the program latch when the program failure is detected from the program latch to a first location of the array of flash memory cells;
transferring second data contained in the cache latch when the program failure occurs from the cache latch to the program latch;
transferring the second data from the program latch to a second location of the array of flash memory cells;
transferring third data contained in a third location of the array of flash memory cells when the program failure is detected to the cache latch;
transferring the third data from the cache latch to the program latch; and
transferring the third data from the program latch to the first location of the array of flash memory cells so as to combine the first data with the third data for reconstructing fourth data originally intended for programming the third location of the array of flash memory cells before the program failure.

33. A mass storage device comprising:
an array of memory cells;
a first latch connected to the array of memory cells;
a second latch connected to the first latch and to the array of memory cells; and
a command control circuit for controlling access to the array of memory cells, wherein the command control circuit is adapted to perform a method, the method comprising:
receiving first data into the first latch;
transferring the first data from the first latch to the second latch;
receiving second data into the first latch;
programming the first data from the second latch into a first plurality of the memory cells;
verifying the programming of the first data into the first plurality of the memory cells;
modifying the data contained in the second latch as the programming is verified, thereby generating an indication of success or failure of individual memory cells of the first plurality of the memory cells;
upon detecting a failure of the programming of the first data into the first plurality of the memory cells:
programming the modified data of the second latch into a second plurality of the memory cells;
transferring the second data from the first latch to the second latch;
programming the second data from the second latch into a third plurality of the memory cells;
transferring the failed data from the first plurality of the memory cells to the second latch; and
combining the failed data from the second latch with the modified data of the second plurality of the memory cells.

34. The mass storage device of claim 33, wherein transferring the failed data from the first plurality of the memory cells to the second latch of the method performed by the command control circuit further comprises transferring the failed data from the first plurality of the memory cells to the first latch and transferring the failed data from the first latch to the second latch.

35. A mass storage device comprising:
a storage array;
at least two serially-connected data input latches coupled to the storage array; and a command control circuit for controlling access to the storage array, wherein the command control circuit is adapted to perform a method, the method comprising:
upon detecting a failure of a programming operation of a first location of the storage array using first data from a first data input latch:
programming a second location of the storage array using second data from the first data input latch indicative of the failure;
programming a third location of the storage array using third data from a second data input latch; and
combining the failed data from the first location of the storage array with the second data in the second location of the storage array.

36. A memory system comprising:
a controller;
a command link connected to the controller;
a data link connected to the controller; and
a flash memory device comprising:
an array of flash memory cells;
a first data register connected to the array of flash memory cells;
a second data register connected to the first data register, to the array of flash memory cells, and to the data link; and
a command control circuit for controlling access to the array of flash memory cells, the command control circuit connected to the command link, wherein the command control circuit is adapted to perform a method when a program failure occurs, the method comprising:
programming a first location of the array of memory cells with first data contained in the first data register when the program failure occurs; and
combining second data contained within a second location of the array of memory cells when the program failure occurs with the first data to reconstruct third data, within the first location, originally intended for programming the memory device before the program failure.

37. The memory system of claim 36, wherein the method performed by the command control circuit further comprises programming a third location of the array of memory cells of the memory device, after programming the first location and before combining the first data with the second data, with fourth data contained in the second data register when the program failure occurs.

38. The memory system of claim 37, wherein the method performed by the command control circuit further comprises transferring the fourth data from the second data register to the first data register before programming the third location.

39. The memory system of claim 36, wherein the method performed by the command control circuit further comprises stopping programming of the memory device that is in progress before the program failure occurs when the program failure occurs.

40. The memory system of claim 36, wherein the method performed by the command control circuit further comprises stopping receiving fourth data for programming the memory device at the second data register of the memory device from the controller.

41. A memory system comprising:
a controller;
a command link connected to the controller;
a data link connected to the controller; and
a flash memory device comprising:
an array of flash memory cells;
a cache latch connected to the array of flash memory cells and to the data link;
a program latch connected to the array of flash memory cells and to the cache latch; and
a command control circuit for controlling access to the array of flash memory cells, the command control circuit connected to the command link, wherein the command control circuit is adapted to perform a method when a program failure occurs, the method comprising:
transferring first data contained in the program latch when the program failure occurs from the program latch to a first location of the array of flash memory cells;
transferring second data contained in the cache latch when the program failure occurs from the cache latch to the program latch;
transferring the second data from the program latch to a second location of the array of flash memory cells;
transferring third data contained in a third location of the array of flash memory cells when the program failure occurs to the cache latch;
transferring the third data from the cache latch to the program latch; and
transferring the third data from the program latch to the first location of the array of flash memory cells so as to combine the first data with the third data for reconstructing fourth data originally intended for programming the third location of the array of flash memory cells before the program failure.

42. The memory system of claim 41, wherein the method performed by the command control circuit further comprises stopping receiving fifth data for programming the memory device at the cache latch from the controller.

43. A memory system comprising:
a controller;
a command link connected to the controller;
a data link connected to the controller; and
a mass storage device comprising:
an array of memory cells;
a first latch connected to the array of memory cells and to the data link;
a second latch connected to the first latch and to the array of memory cells; and
a command control circuit for controlling access to the array of memory cells, the command control circuit connected to the command link, wherein the command control circuit is adapted to perform a method, the method comprising:
receiving first data into the first latch from the controller;
transferring the first data from the first latch to the second latch;
receiving second data into the first latch from the controller;
programming the first data from the second latch into a first plurality of the memory cells;
verifying the programming of the first data into the first plurality of the memory cells;
modifying the data contained in the second latch as the programming is verified, thereby generating an indication of success or failure of individual memory cells of the first plurality of the memory cells;
upon detecting a failure of the programming of the first data into the first plurality of the memory cells:

programming the modified data of the second latch into a second plurality of the memory cells;
transferring the second data from the first latch to the second latch;
programming the second data from the second latch into a third plurality of the memory cells;

transferring the failed data from the first plurality of the memory cells to the second latch; and
combining the failed data from the second latch with the modified data of the second plurality of the memory cells.

* * * * *